US006031731A

United States Patent [19]

Suesada et al.

[11] Patent Number: 6,031,731

[45] Date of Patent: Feb. 29, 2000

[54] MOBILE COMMUNICATION APPARATUS HAVING A SELECTING PLATE MOUNTED ON CIRCUIT BOARD

[75] Inventors: Tsuyoshi Suesada, Shiga-ken; Yujiro Dakeyo, Omihachiman; Seiji Kanba, Otsu; Teruhisa Tsuru, Kameoka, all of Japan

[73] Assignee: Murata Manufacturing Co., Ltd., Japan

[21] Appl. No.: 09/078,079

[22] Filed: May 13, 1998

[30] Foreign Application Priority Data

May 14, 1997 [JP] Japan .................................... 9-124213
Apr. 15, 1998 [JP] Japan .................................. 10-104528

[51] Int. Cl.[7] ........................................................ H05K 9/00

[52] U.S. Cl. .......................... 361/800; 361/752; 361/799; 361/814; 361/816; 174/35 R

[58] Field of Search ..................................... 361/752, 796, 361/799, 800, 814, 816, 818; 343/702; 174/35 GC, 35 R, 35 MS; 455/89, 90; 379/59, 440

[56] References Cited

U.S. PATENT DOCUMENTS 4,924,237 5/1990 Honda et al. ........................... 343/702
5,014,160 5/1991 McCoy, Jr. ............................. 361/818
5,053,924 10/1991 Kurgan ................................... 361/818
5,160,807 11/1992 Fry et al. ............................. 174/35 R
5,493,704 2/1996 Grangeat et al. ................... 343/702 X
5,613,221 3/1997 Hunt .................................... 343/702 X
5,729,441 3/1998 Murakami ................................. 61/818
5,802,458 9/1998 Van Zeijl et al. .................. 343/702 X

*Primary Examiner*—Leo P. Picard
*Assistant Examiner*—Jayprakash N. Gandhi
*Attorney, Agent, or Firm*—Ostrolenk, Faber, Gerb & Soffen, LLP

[57] ABSTRACT

A mobile cellular telephone 10 has a case 11 which is formed of frame portions 11*a through* 11*f made of, for example, a reinforced plastic, a non-directional chip antenna* 12, a circuit board 13 having the chip antenna 12 on one major surface (first major surface) 13*a, and a copper-made reflective plate* 14, which serves as means for attenuating a transmission output of the chip antenna 12. The reflecting plate 14 is provided between the circuit board 13 and the frame portion 14*e in such a manner that it faces the first major surface* 13*a of the circuit board* 13 with an intervening gap. Also, the reflecting plate 14 is connected to the ground pattern 19.

4 Claims, 5 Drawing Sheets

FIG. 9
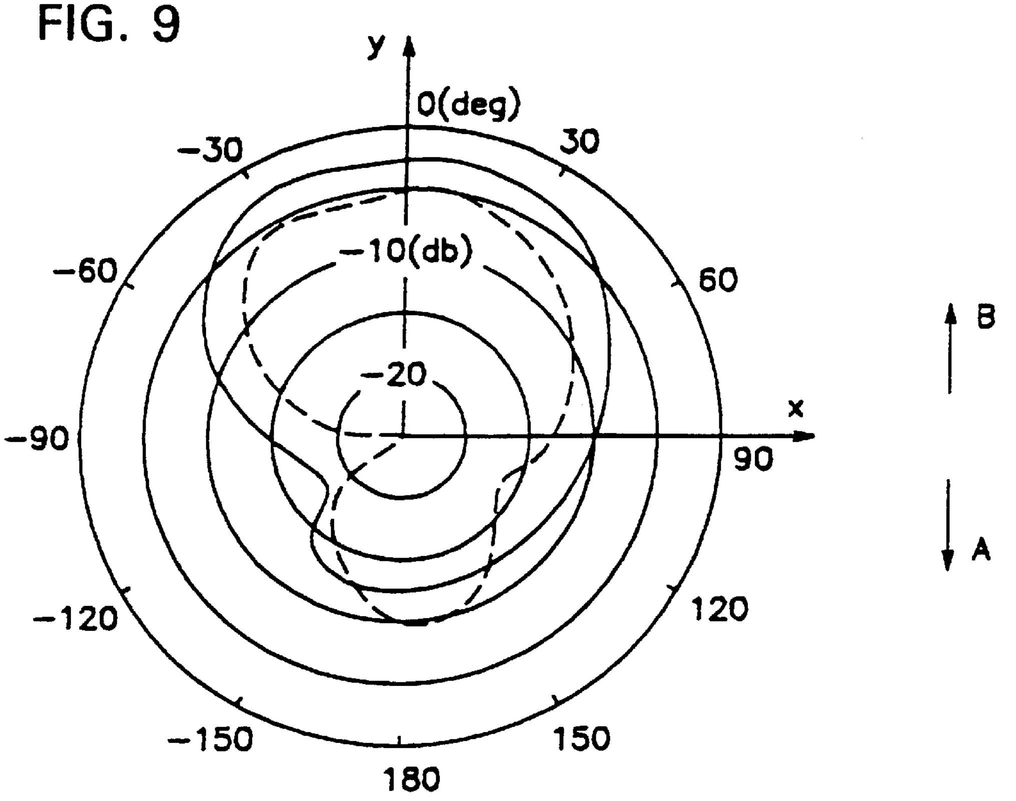
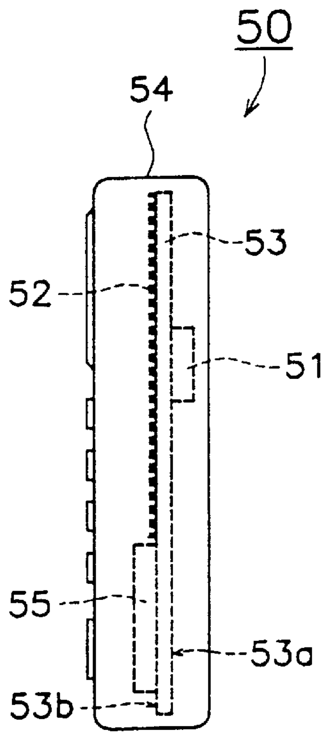
FIG. 10
PRIOR ART

MOBILE COMMUNICATION APPARATUS HAVING A SELECTING PLATE MOUNTED ON CIRCUIT BOARD

BACKGROUND OF THE INVENTION

1. Technical Field of the Invention

The present invention relates to mobile communication apparatuses having a built-in type chip antenna for use in mobile communications and local area networks.

2. Related Art of the Invention

A known mobile communication apparatus, for example, a mobile cellular telephone 50, is formed, as shown in FIG. 10, by disposing a circuit board 53 within a case 54. The circuit board 53 is configured in such a manner that a non-directional chip antenna 51 is mounted on one major surface (first major surface) 53*a* and a ground pattern 52 is provided on the other major surface (second major surface) 53*b*. Radio waves are received by the chip antenna 51. In this configuration, the chip antenna 51 is electrically connected via a transmission line (not shown) on the circuit board 53 to an RF portion 55 of the cellular telephone 50 disposed on the second major surface 53*b*. The bandwidth of the chip antenna 51 is determined by the stray capacitance generated between the chip antenna 51 and the ground pattern 52 provided on the second major surface 53*b* of the circuit board 53.

However, in the above mobile cellular telephone, which serves as a known mobile communication apparatus, since the chip antenna has non-directional characteristics, transmitting radio waves are influenced by a user holding the telephone while using it, thereby deteriorating the antenna characteristics. In order to overcome this drawback, the ground pattern is provided on the second major surface of the circuit board opposite to the first major surface on which the chip antenna is mounted.

However, the following problem is presented. For increasing the bandwidth of the chip antenna, the stray capacitance generated between the chip antenna and the ground pattern provided on the second major surface of the circuit board should be increased. This disadvantageously enlarges the ground pattern, and inevitably also increases the size of the circuit board, resulting in an enlargement of the cellular telephone.

Further, the RF portion of the cellular telephone is mounted on the first major surface of the circuit board, thereby restricting the position at which the ground pattern is formed on the first major surface of the circuit board.

SUMMERY OF THE INVENTION

In order to overcome the above problems, it is an object of the present invention to provide a miniaturized mobile communication apparatus having an increased bandwidth.

The present invention provides a mobile communication apparatus, comprising: a circuit board having a ground pattern thereon; a non-directional chip antenna mounted on the circuit board; and a case housing the circuit board and the non-directional chip antenna; wherein a reflecting plate is provided between a first major surface of the circuit board and the case with a space between the reflecting plate and the circuit board and electrically connected to the ground pattern on the circuit board.

In the above described mobile communication apparatus, the chip antenna may be mounted on the first or second major surface of said circuit board.

In the above described mobile communication apparatus, the chip antenna may comprise a substrate made of at least one of a dielectric material and a magnetic material, at least one conductor provided at least on a surface of the substrate and within the substrate, and at least one feeding terminal provided on a surface of the substrate in order to apply a voltage to the conductor.

According to the mobile communication apparatus of the present invention, a circuit board is configured in such a manner that a chip antenna is mounted on a first or second major surface and a ground pattern is provided on the first major surface. A reflecting plate is electrically connected to the ground pattern on the circuit board. The first major surface of the circuit board and the reflecting plate are placed to face each other with an intervening gap therebetween. Thus, limitations on the mounting position of the chip antenna and the forming position of the ground pattern are reduced, thereby significantly enhancing the flexibility of positioning the parts within the case and designing the circuit.

Moreover, in order to increase the bandwidth, it is not necessary to increase the size of the circuit board on which the ground pattern is provided, thereby achieving a miniaturized cellular telephone having an increased bandwidth.

Further, the reflecting plate, which is electrically connected to the ground pattern on the circuit board, is provided between the circuit board and a frame portion, which forms a case within which the non-directional chip antenna is stored. Consequently, due to the reflection effect of the reflecting plate, the transmission output of the chip antenna is reliably reflected in the direction opposite to the direction in which the reflecting plate is disposed. This makes it possible to provide a mobile communication apparatus with a directivity in a specific direction.

As a consequence, a reflecting plate is provided on the side of the user holding the cellular telephone, thereby reducing the influence of the user, which would otherwise cause a decrease in the antenna characteristics during the transmitting and receiving operation.

Further, since the chip antenna has a rectangular-prism-shaped substrate essentially consisting of barium oxide, aluminum oxide, and silica, the propagation speed is decreased, which further causes a shortened wavelength. Accordingly, when the relative dielectric constant of the substrate is indicated by $\epsilon$, the effective line length is increased by $\epsilon^{1/2}$, which is longer than the effective line length of a known linear antenna. Thus, the current is distributed over a wider area, and accordingly, the amount of radiating waves is increased, there enhancing the gain of the chip antenna. In other words, if the gain of a chip antenna is the same as that of a known antenna, the chip antenna can be miniaturized. As a result, a cellular telephone having the miniaturized chip antenna is accordingly downsized.

Other features and advantages of the present invention will become apparent from the following description of the invention which refers to the accompanying drawings.

BRIEF DESCRIPTION OF THE DRAWINGS

FIG. 9 illustrates the antenna gain when the user approaches from the direction A.

FIG. 10 is a side view, partially perspective, illustrating a mobile cellular telephone, which serves as a prior art mobile communication apparatus.

PREFERRED EMBODIMENTS OF THE PRESENT INVENTION

A mobile communication apparatus according to the present invention, for example, a mobile cellular telephone, is described below with reference to the drawings.

Figure 1:
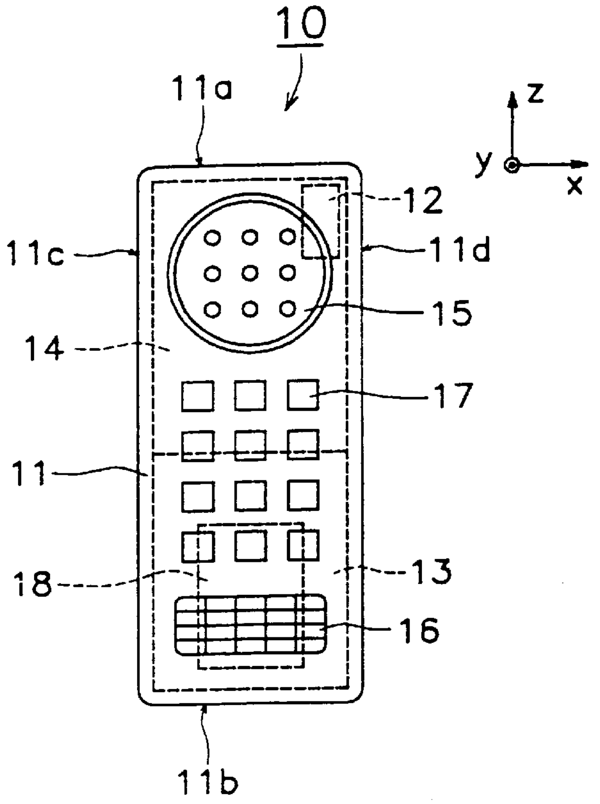
FIG. 1 is a front view, partially perspective, illustrating a mobile cellular telephone according to a first embodiment of a mobile communication apparatus of the present invention.
Figure 2:
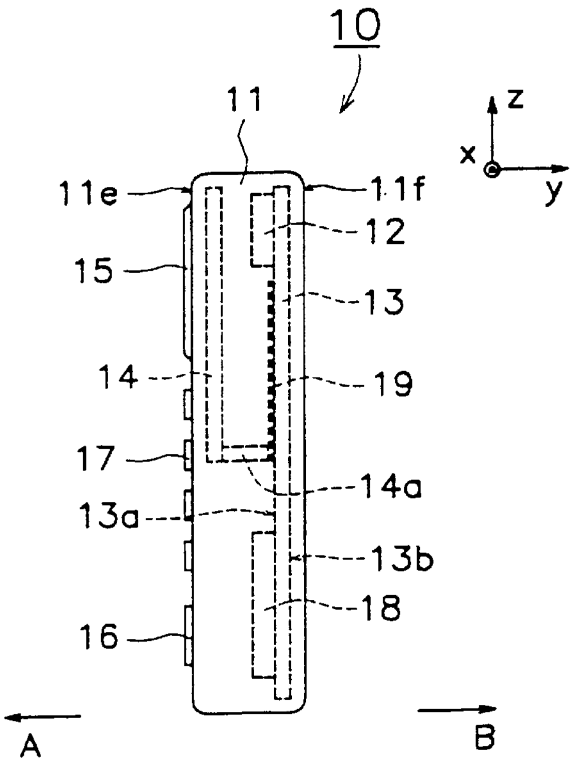
FIG. 2 is a side view, partially perspective, illustrating the mobile communication apparatus shown in FIG. 1.

FIGS. 1 and 2 are respectively a front view and a side view, both of which are partially perspective, of a first embodiment of a mobile communication apparatus according to the present invention. In FIGS. 1 and 2, a mobile cellular telephone 10 comprises a case 11, which has frame portions 11*a* through 11*f* made of, for example, a reinforced plastic, a non-directional chip antenna 12, a circuit board 13 having the chip antenna 12 on one major surface (first major surface) 13*a*, and a copper-made reflecting plate 14, which serves as means for attenuating a transmission output of the chip antenna 12.

The frame portion 11*e*, which forms the case 11, has a telephone receiver 15, a telephone transmitter 16, and dial keys 17. Moreover, the chip antenna 12 is electrically connected via a transmission line (not shown) on the circuit board 13 to an RF portion 18 of the cellular telephone 10 disposed on the first major surface 13*a* of the circuit board 13.

Further, the reflecting plate 14 is disposed between the circuit board 13 and the frame portion 11*e* in such a manner that it faces the first major surface 13*a* with an intervening gap. Also, the reflecting plate 14 is connected to a ground pattern 19 provided on the first major surface 13*a* of the circuit board 13 via a short-circuit plate 14*a*.

Generally, in order to increase the bandwidth of the mobile cellular telephone 10, it is necessary to increase the capacitance between the chip antenna 12 and the ground pattern 19 provided on the first major surface 13*a* of the circuit board 13. According to the configuration of the cellular telephone 10 shown in FIG. 1, the circuit board 13 and the reflecting plate 14, which is connected to the ground pattern 19 on the first major surface 13*a* of the circuit board 13, are placed to face each other with a gap therebetween. Thus, only the reflecting plate 14 is required to be enlarged to increase the capacitance between the chip antenna 12 and the ground pattern 19 on the first major surface 13*a* of the circuit board 13 without needing to increase the size of the circuit board 13. This makes it possible to reduce the size and to increase the bandwidth of the cellular telephone 10.

Figure 3:
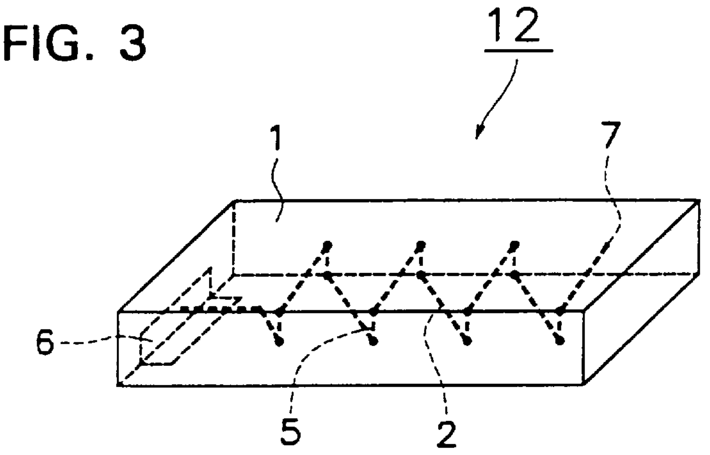
FIG. 3 is a perspective view illustrating a chip antenna usable for the mobile communication apparatus shown in FIG. 1.
Figure 4:
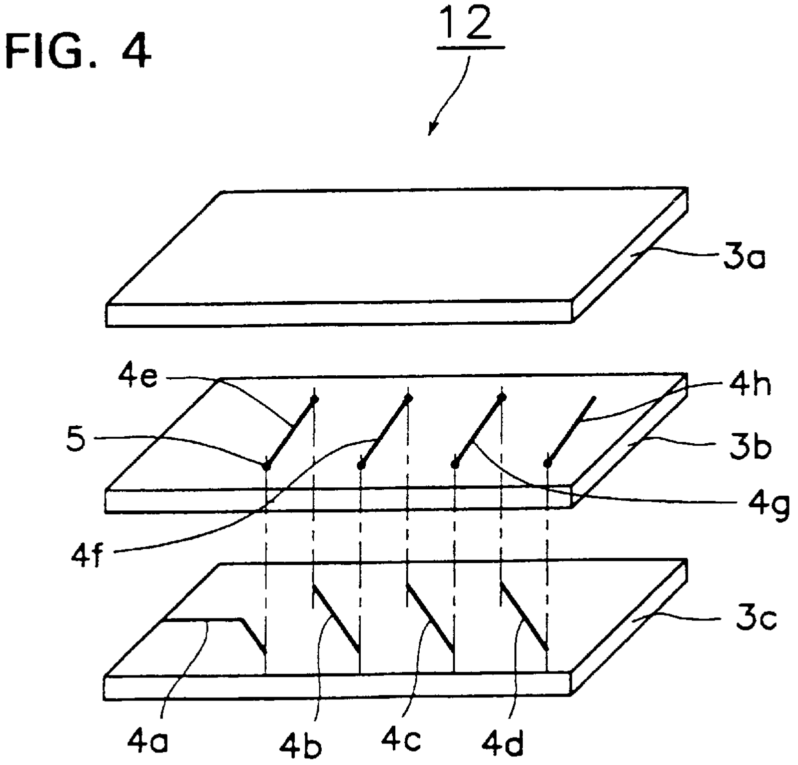
FIG. 4 is an exploded perspective view illustrating the chip antenna shown in FIG. 3.

The chip antenna 12 has a conductor 2, as illustrated in FIGS. 3 and 4, disposed within a rectangular-prism-shaped substrate 1 in such a manner that the conductor 2 is spirally wound in the longitudinal direction of the substrate 1. The substrate 1 is formed by laminating rectangular sheet layers 3*a* through 3*c*, which are made of a dielectric material essentially consisting of barium oxide, aluminum oxide, and silica.

Formed on the surfaces of the sheet layers 3*b* and 3*c* by means such as printing, vapor-depositing, laminating, or plating are conductive patterns 4*a* through 4*h*, which are substantially linear or formed substantially in an L shape, and formed of copper or a copper alloy.

Moreover, provided at predetermined positions (both ends of the conductive patterns 4*e* through 4*g* and one end of the conductive pattern 4*h*) of the sheet layers 3*b* and 3*c* are via-holes 5 along the thickness of the layers 3*b* and 3*c*.

The sheet layers 3*a* through 3*c* are then laminated and sintered, and the conductive patterns 4*a* through 4*h* are connected through the via-holes 5, thereby forming the conductor 2 spirally wound within the substrate 1 in the longitudinal direction of the substrate 1.

One end of the conductor 2 (one end of the conductive pattern 4*a*) is led to an end face of the substrate 1 and is connected to a feeding terminal 6 which is provided over the surfaces of the substrate 1 and which is used for applying a voltage to the conductor 2. The other end of the conductor 2 (one end of the conductive pattern 4*h*) forms a free end 7 within the substrate 1.

Figure 5:
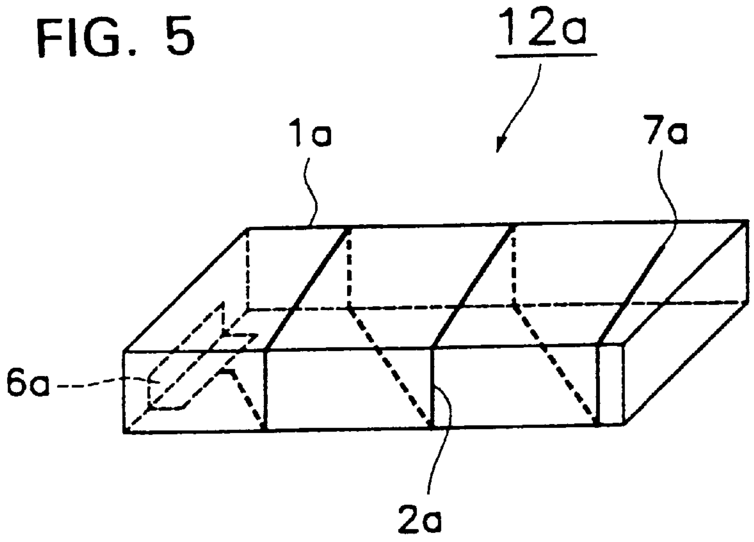
FIG. 5 is a perspective view illustrating an example of modifications made to the chip antenna shown in FIG. 3.
Figure 6:
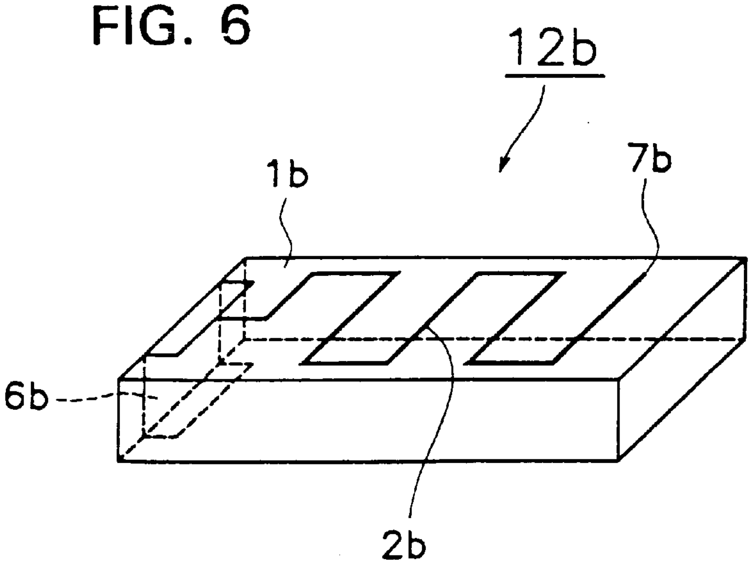
FIG. 6 is a perspective view illustrating another example of modifications made to the chip antenna shown in FIG. 3.

FIGS. 5 and 6 are perspective views of examples of modifications made to the chip antenna 12 shown in FIG. 3. A chip antenna 12*a* illustrated in FIG. 5 has a rectangular-prism-shaped substrate 1*a*, a conductor 2*a* spirally wound along the surfaces of the substrate 1*a* in the longitudinal direction of the substrate 1*a*, and a feeding terminal 6*a* provided over the surfaces of the substrate 1*a* and used for applying a voltage to the conductor 2*a*. With this configuration, one end of the conductor 2*a* is connected on the surface of the substrate 1*a* to the feeding terminal 6*a*, while the other end of the conductor 2*a* forms a free end 7*a* on the surface of the substrate 1*a*. In this example, the conductor 2*a* can be easily formed spirally on the surfaces of the substrate 1*a* by means such as screen printing, thereby simplifying the manufacturing process of the chip antenna 12*a*.

A chip antenna 12*b* illustrated in FIG. 6 has a rectangular-prism-shaped substrate 1*b*, a meandering conductor 2*b* formed on the surface (one major surface) of the substrate 1*b*, and a feeding terminal 6*b* provided over the surfaces of the substrate 1*b* and used for applying a voltage to the conductor 2*b*. With this configuration, one end of the conductor 2*b* is connected on the surface of the substrate 1*b* to the feeding terminal 6*b*, while the other end of the conductor 2*b* forms a free end 7*b* on the surface of the substrate 1*b*. In this example, since the meandering conductor 2*b* is formed only on one major surface of the substrate 1*b*, the height of the substrate 1*b* can be decreased, thereby accordingly reducing the height of the chip antenna 12*b*. It should be noted that the meandering conductor 2*b* may be formed within the substrate 1*b*.

Figure 7:
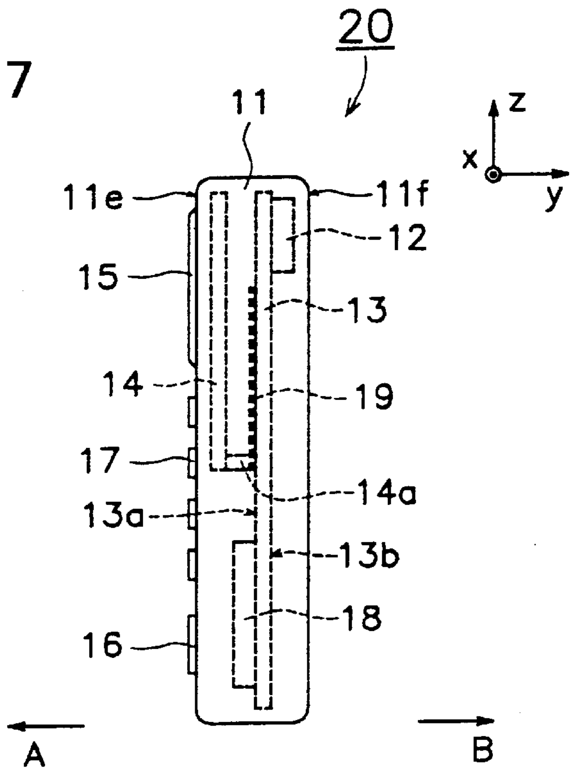
FIG. 7 is a side view, partially perspective, illustrating a mobile cellular telephone according to a second embodiment of a mobile communication apparatus of the present invention.

FIG. 7 is a side view, which is partially perspective, illustrating a second embodiment of a mobile communication apparatus according to the present invention. A mobile cellular telephone 20 differs from the cellular telephone 10 of the first embodiment in that the chip antenna 12 is mounted on the other major surface (second major surface) 13*b* of the circuit board 13.

Figure 8:
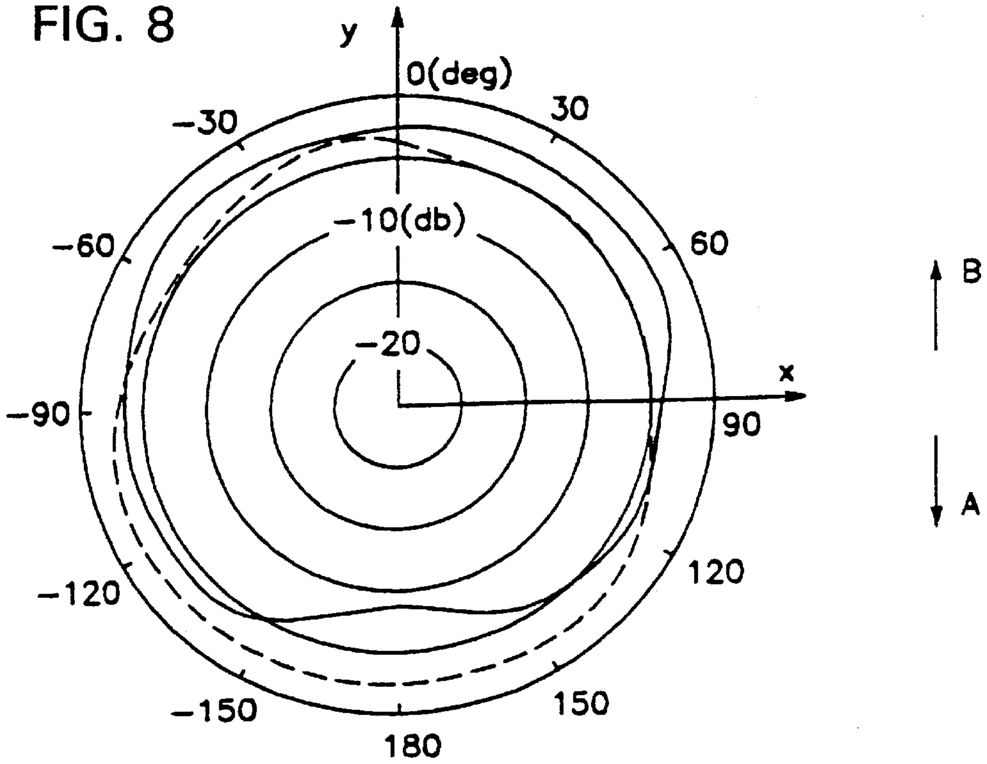
FIG. 8 illustrates the antenna gain when the user does not approach from the direction A.

FIG. 8 illustrates the results obtained by comparing the antenna gain of the mobile cellular telephones 10 and 20 (FIGS. 1 and 7) of the respective first and second embodiments with the antenna gain of a cellular telephone without a reflecting plate when a user did not approach from the direction A to hold the telephone. In FIG. 8, the solid lines indicate the antenna gain of the cellular telephones 10 and 20 of the respective first and second embodiments, while the broken line represents the antenna gain of the telephone without a reflecting plate. The directions x, y, and z and the directions A and B correspond to those shown in FIGS. 2 and 7. Comparing the cellular telephones 10 and 20 of the respective first and second embodiments to the cellular telephone without a reflecting plate, FIG. 8 clearly reveals that the antenna gain on the side on which the reflecting plate is provided (the direction A) is decreased, and the antenna gain on the side opposite to the direction A (the direction B) is increased.

This is due to the fact that the transmission output of the chip antenna 12 is reliably reflected in the direction opposite to the direction in which the reflecting plate 14 is provided, i.e., in the direction B, by virtue of the reflection effect of the reflecting plate 14.

FIG. 9 illustrates the results obtained by comparing the antenna gain of the cellular telephones 10 and 20 of the first and second embodiments (FIGS. 1 and 7) with the antenna gain of the cellular telephone without a reflecting plate when the user approached from the direction A to take hold of the telephone. In FIG. 9, the solid lines indicate the antenna gain of the cellular telephones 10 and 20 of the respective first and second embodiments, while the broken line represents the antenna gain of the cellular telephone without a reflecting plate. The directions x, y, and z and the directions A and B correspond to those shown in FIGS. 2 and 7.

In regard to the cellular telephone without a reflecting plate, FIG. 9 indicates that the user approaching from the direction A to take hold of the telephone influences the antenna gain in the direction B, thereby lowering the antenna gain in the overall peripheral direction.

In contrast, in regard to the cellular telephones 10 and 20 of the respective first and second embodiments provided with a reflecting plate, the antenna gain in the direction B is hardly lowered, and therefore, there is no influence by the user approaching from the direction A to take hold of the telephone.

As discussed above, the antenna gain is lowered if the user approaches to take hold of the cellular telephone. This is because the electromagnetic waves around the telephone are disturbed by the user. In the cellular telephones of the respective first and second embodiments provided with a reflecting plate, however, by virtue of the reflection effect of the reflecting plate, the transmitting radio waves are hardly output in the direction in which the reflecting plate is provided. Accordingly, electromagnetic waves are not disturbed even if the user approaches to take hold of the telephone.

This proves that the provision of a reflecting plate for the cellular telephone on the side on which the user holds the telephone sufficiently inhibits the user's influence on the transmitting radio waves while the telephone is being used.

According to the above description, in the first and second embodiments, a circuit board is provided in such a manner that a chip antenna is mounted on a first or second major surface and a ground pattern is formed on the first major surface. A reflecting plate is connected to the ground pattern of the circuit board. The first major surface of the circuit board and the reflecting plate are placed to face each other with an intervening gap therebetween. Thus, limitations on the mounting position of the chip antenna and the forming position of the ground pattern are reduced, thereby significantly improving the flexibility of positioning the parts within the case and designing the circuit.

Moreover, in order to increase the bandwidth, it is not necessary to increase the size of the circuit board on which the ground pattern is formed, thereby achieving a miniaturized cellular telephone having an increased bandwidth.

Further, the reflecting plate, which is connected to the ground pattern on the circuit board, is provided between the circuit board and a frame portion, which forms a case for accommodating the non-directional chip therein. Consequently, due to the reflection effect of the reflecting plate, the transmission output of the chip antenna is reliably reflected in the direction opposite to the direction in which the reflecting plate is disposed. This makes it possible to provide a mobile communication apparatus with a directivity in a specific direction.

As a consequence, a reflecting plate is provided on the side of the user holding the cellular telephone, thereby reducing the influence of the user, which would otherwise cause a decrease in the antenna characteristics during the transmitting and receiving operation.

Further, since the chip antenna has a rectangular-prism-shaped substrate essentially consisting of barium oxide, aluminum oxide, and silica, the propagation speed is decreased, which further causes a shortened wavelength. Accordingly, when the relative dielectric constant of the substrate is indicated by $\epsilon$, the effective line length is increased by $\epsilon^{1/2}$, which is longer than the effective line length of a known linear antenna. Thus, the current is distributed over a wider area, and accordingly, the amount of radiating waves is increased, thereby enhancing the gain of the chip antenna. In other words, if the gain of a chip antenna is set to that of a known antenna, the chip antenna can be miniaturized over the known antenna. As a result, a cellular telephone having the miniaturized chip antenna can be downsized.

According to the first and second embodiments, the substrate of the chip antenna is formed from a dielectric material essentially consisting of barium oxide, aluminum oxide, and silica. However, the substrate is not restricted to the above dielectric material, and may be a dielectric material essentially consisting of titanium oxide and neodymium oxide, a magnetic material essentially consisting of nickel, cobalt, and iron, or a combination of a dielectric material and a magnetic material.

Moreover, although only one conductor is used for the chip antenna in the foregoing embodiments, a plurality of conductors placed in parallel to each other may be used to form the chip antenna. In this case, the resulting chip antenna may have a plurality of resonant frequencies in accordance with the number of conductors, thereby making it possible to cope with multi-bands with only a single antenna.

Additionally, according to the foregoing embodiments, a conductor is formed within or on the surface of the substrate of the chip antenna. Conductors may be formed both within and on the surface of the substrate.

The reflecting plate may be positioned at any portion as long as it is provided between the circuit board and the frame portion, which is positioned in the direction in which the transmission output of the non-directional chip antenna is reflected.

Further, although a copper plate is used for the reflecting plate, a conductor formed on a printed board or a ceramic board by means such as vapor-depositing or plating may be used for the reflecting plate. In this case, advantages similar to those exhibited by the use of the copper plate are offered.

Moreover, according to the foregoing embodiments, the reflecting plate is formed separately from the frame portion for forming the case. However, the reflecting plate may be formed of a sheet-like conductor directly laminated on the frame portion or a conductor formed by directly placing a vapor-deposited or plated film on the case. The reflecting plate may be then connected via a short-circuit plate to the ground pattern provided on the first major surface of the circuit board. In this case, since the reflecting plate is directly laminated on the frame portion for forming the case, the thickness of the case can be reduced, thereby making the resulting mobile communication apparatus thinner.

While the invention has been particularly shown and described with reference to preferred embodiments thereof, it will be understood by those skilled man in the art that the forgoing and other changes in form and details may be made therein without departing from the spirit of the invention.

What is claimed is:

1. A mobile communication apparatus, comprising:

a circuit board having a ground pattern thereon;

a non-directional chip antenna mounted on the circuit board; and a case housing the circuit board and non-directional chip antenna; wherein a reflecting plate is provided between a first major surface of the circuit board and the case with a space between the reflecting plate and the circuit board and the reflecting plate is electrically connected to the ground pattern on the circuit board and only at approximately a center portion of the circuit board in a longitudinal direction of the circuit board, the chip antenna being disposed at approximately an end portion of the circuit board in the longitudinal direction of the circuit board.

2. The mobile communication apparatus according to claim 1, wherein the chip antenna is mounted on the first major surface of said circuit board.

3. The mobile communication apparatus according to claim 1, wherein the chip antenna is mounted on a second major surface of said circuit board.

4. The mobile communication apparatus according to claim 1, wherein the chip antenna comprises a substrate made of at least one of a dielectric material and a magnetic material, at least one conductor provided at least on a surface of the substrate and within the substrate, and at least one feeding terminal provided on a surface of the substrate in order to apply a voltage to the conductor.

* * * * *